US012100786B2

(12) United States Patent
Basin et al.

(10) Patent No.: US 12,100,786 B2
(45) Date of Patent: Sep. 24, 2024

(54) LIGHT EMITTING DEVICE WITH HIGH NEAR-FIELD CONTRAST RATIO

(71) Applicant: LUMILEDS LLC, San Jose, CA (US)

(72) Inventors: Grigoriy Basin, San Francisco, CA (US); Lex Alan Kosowsky, San Jose, CA (US); Chee Ming Thoe, Jelutong (MY); Choon Earn Chan, Gelugor (MY)

(73) Assignee: LUMILEDS LLC, San Jose, CA (US)

( * ) Notice: Subject to any disclaimer, the term of this patent is extended or adjusted under 35 U.S.C. 154(b) by 672 days.

(21) Appl. No.: 17/341,743

(22) Filed: Jun. 8, 2021

(65) Prior Publication Data

US 2021/0296541 A1    Sep. 23, 2021

Related U.S. Application Data

(63) Continuation of application No. 16/529,078, filed on Aug. 1, 2019, now Pat. No. 11,056,618.
(Continued)

(30) Foreign Application Priority Data

Oct. 18, 2018    (EP) .................................... 18201119

(51) Int. Cl.
*H01L 33/50*    (2010.01)
*H01L 33/60*    (2010.01)

(52) U.S. Cl.
CPC .......... *H01L 33/501* (2013.01); *H01L 33/505* (2013.01); *H01L 33/60* (2013.01);
(Continued)

(58) Field of Classification Search
CPC ..... H01L 33/501; H01L 33/505; H01L 33/58; H01L 33/60; H01L 33/56; H01L 2933/0041
(Continued)

(56) References Cited

U.S. PATENT DOCUMENTS

2004/0211970 A1    10/2004 Hayashimoto et al.
2012/0235169 A1    9/2012 Seko et al.
(Continued)

FOREIGN PATENT DOCUMENTS

EP    3142158 A1    3/2017
JP    2008166661 A    7/2008
(Continued)

OTHER PUBLICATIONS

Extended European Search Report corresponding to EP18201119.7, Mar. 20, 2019, 6 pages.
(Continued)

*Primary Examiner* — Peter Bradford

(57) ABSTRACT

A light emitting device includes an LED having a light emitting top surface and sidewalls. A phosphor structure is attached to the light emitting surface of the LED. The phosphor structure has a light emitting top surface facing away from the LED light emitting surface, and sidewalls. A light reflective material is arranged to cover the sidewalls of the LED and the phosphor structure. A light absorptive region is defined in the light reflective material around a perimeter of the light emitting surface of the phosphor structure. The light absorptive region may be spaced apart from the perimeter of the phosphor structure by a gap. The light absorptive region may be formed by ultraviolet laser illumination of the light reflecting material.

19 Claims, 3 Drawing Sheets

Related U.S. Application Data

(60) Provisional application No. 62/714,371, filed on Aug. 3, 2018.

(52) U.S. Cl.
CPC ............ *H01L 2933/0041* (2013.01); *H01L 2933/0058* (2013.01)

(58) Field of Classification Search
USPC ............ 257/98, 100; 438/22, 25, 26.27, 29
See application file for complete search history.

(56) References Cited

U.S. PATENT DOCUMENTS

| | | |
|---|---|---|
| 2013/0285084 A1 | 10/2013 | Schneider et al. |
| 2016/0315229 A1 | 10/2016 | Dai et al. |
| 2018/0097158 A1 | 4/2018 | Estrada et al. |

FOREIGN PATENT DOCUMENTS

| | | |
|---|---|---|
| JP | 2010157638 A | 7/2010 |
| JP | 2010171116 A | 8/2010 |
| JP | 5521325 B2 | 6/2014 |
| WO | 2011010234 A1 | 1/2011 |

OTHER PUBLICATIONS

From the EPO as the ISA, International Search Report and Written Opinion of the International Searching Authority, corresponding to PCT/US2019/044818, Oct. 18, 2019, 11 pages.
European Patent Office Publication No. EP2457267A0, corresponding to WO2011010234A1, 1 page.

LIGHT EMITTING DEVICE WITH HIGH NEAR-FIELD CONTRAST RATIO

CROSS REFERENCE TO RELATED APPLICATIONS

This application is a continuation of U.S. application Ser. No. 16/529,078 filed on Aug. 1, 2019, which claims priority to U.S. Provisional Patent Application 62/714,371 filed Aug. 3, 2018 and to European Patent Application 18201119.7 filed Oct. 18, 2018. All of the above-listed applications are incorporated herein by reference in their entirety.

TECHNICAL FIELD

The present disclosure generally relates to manufacturing light emitting devices with a high near-field contrast ratio. A thin region of light absorbing material can be defined around edges of a top side light emitting area, providing a sharp contrast between light emitting areas and areas not intended to emit light.

BACKGROUND

Semiconductor light-emitting devices can be manufactured to include a combination of a light emitting diode (LED) in combination with a phosphor structure comprising a relatively thick ceramic phosphor, or a phosphor structure comprising phosphor particles embedded in a binder such as silicone, for example. Light passes from a light emitting surface (e.g., a top surface) of the LED into the phosphor, with some or all of the light emitted by the LED being wavelength converted by the phosphor to provide a desired light spectral output through a light emitting surface of the phosphor. Typically, some portion of the light emitted by the LED is effectively wasted by reflection or direct transmission out the side of the LED, rather than through the top of LED into the phosphor structure. To minimize this waste, reflective materials can be used to reflect side emitted light back into the phosphor structure. For example, one common packaging technique uses an overmold side coat process that encapsulates LED and phosphor sidewalls with a highly reflective light material. Such encapsulation acts as a light reflector to provide sharp luminance cut-off outside of the desired light emitting area of the phosphor, minimize the amount of stray light, and improve near-field contrast.

Even with such overmold packaging, near-field contrast can be reduced by stray light scattered by a submount, by light that is side scattered and reflected from the phosphor, or by light transmitted through a phosphor sidewall due to partial exposure of the phosphor sidewall during bead blast processing or cleaning of the top light emitting surface of the phosphor structure. This contrast reducing stray light can be particularly detrimental for applications with primary or secondary optics, including camera flash modules, automotive front lighting, and other light projection systems.

SUMMARY

Light emitting devices described herein may provide a high near-field contrast ratio. In one embodiment, a thin region of light absorbing material can be defined parallel to edges of a light emitting surface (e.g., a top surface) of the light emitting device, providing a sharp contrast between the light emitting surface and a surrounding area.

In another embodiment, a light emitting device includes an LED having a light emitting surface (e.g., a top surface) and sidewalls. A phosphor structure is attached to the light emitting surface of the LED. The phosphor structure has a light emitting surface (e.g., a top surface) facing away from the LED light emitting surface, and sidewalls. A light reflective material is arranged to cover the sidewalls of the LED and the phosphor structure. A light absorptive region is defined in the light reflective material around a perimeter of the light emitting surface of the phosphor structure. The light absorptive region may be spaced apart from the perimeter of the phosphor structure by a gap. The gap may have a width, for example, of at least 30 microns in the plane of the phosphor structure light emitting surface.

The light reflective material can include at least one of $SiO_2$, $Y_2O_3$, $TiO_2$, or $Al_2O_3$. In some embodiments, 70% to 80% $TiO_2$ and/or $SiO_2$ with a binding agent can be used. Silicone rubber can be used as the binding agent.

The light reflective material can be illuminated with a laser to form the light absorptive region in an outer surface of the light reflective material adjacent to the perimeter of the light emitting surface of the phosphor structure. A gap may be defined between the phosphor and the light absorptive region. The gap may have a width between about 40 and about 80 microns, for example, in the plane of the phosphor structure light emitting surface. The width of the light absorptive region may be between about 100 and 200 microns, for example, in the plane of the light emitting surface of the phosphor structure. The light absorptive region may penetrate into the light reflective material perpendicular to the plane of the light emitting surface of the phosphor structure to a depth of between about 40 and about 80 microns, for example.

A method of manufacturing a light emitting device is also described. Method steps include providing a top emitting LED having a top surface and sidewalls. A phosphor is attached to the top emitting LED, the phosphor having a top side and sidewall. A light reflective material is molded or otherwise dispensed to cover the sidewalls of the LED and the phosphor. This light reflective material is illuminated with a laser to define a light absorptive r positioned to at least partially surround the phosphor and optionally define a gap therebetween of, for example, at least 30 microns in the plane of the light emitting surface of the phosphor structure.

BRIEF DESCRIPTION OF THE DRAWINGS

Non-limiting and non-exhaustive embodiments of the present disclosure are described with reference to the following figures, wherein like reference numerals refer to like parts throughout the various figures unless otherwise specified.

DETAILED DESCRIPTION

Figure 1:
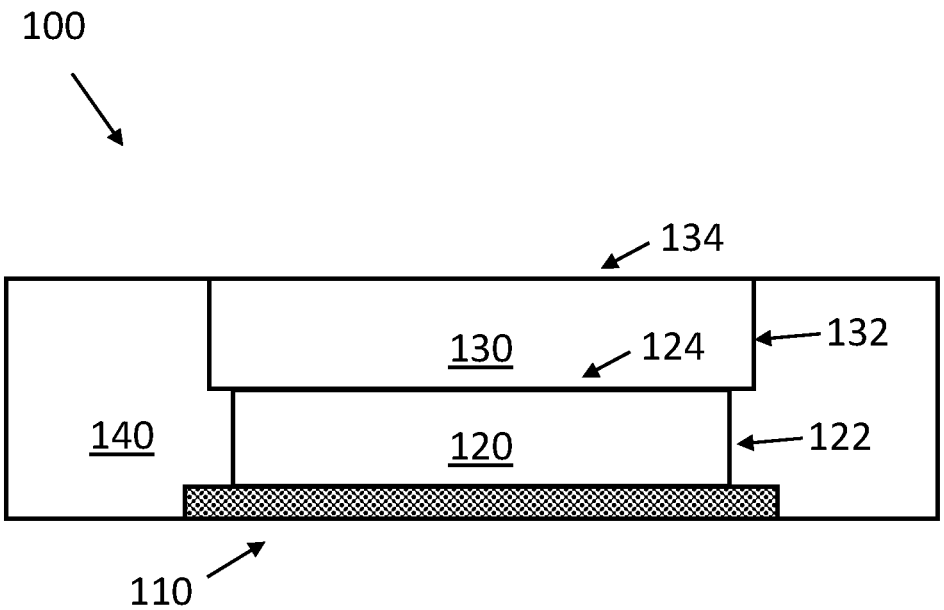
FIG. 1 is a side cross-sectional view illustrating a light emitting device.

As seen in FIG. 1, a light emitting device 100 includes a substrate 110 supporting a semiconductor LED 120 with sidewalls 122 and light emitting top surface 124. Phosphor structure 130 with sidewalls 132 and light emitting top surface 134 is positioned on the semiconductor LED 120. Respective sidewalls 122 and 132 of the semiconductor LED 120 and phosphor structure 130 are covered with a light reflective material 140 that completely or partially surrounds the semiconductor LED 120 and phosphor structure 130.

The substrate 110 can be formed of sapphire or silicon carbide that is able to support an epitaxially grown or deposited semiconductor n-layer. A semiconductor p-layer can be sequentially grown or deposited on the n-layer, forming an active region at the junction between layers. Semiconductor materials capable of forming high-brightness light emitting devices can include, but are not limited to, Group III-V semiconductors, particularly binary, ternary, and quaternary alloys of gallium, aluminum, indium, and nitrogen, also referred to as III-nitride materials.

Phosphor structure 130 can include one or more wavelength converting materials able to create white light or monochromatic light of other colors. All or only a portion of the light emitted by the LED 120 may be converted by the wavelength converting material of the phosphor 130. Unconverted light may be part of the final spectrum of light, though it need not be. Examples of common devices include a blue-emitting LED combined with a yellow-emitting phosphor, a blue-emitting LED combined with green- and red-emitting phosphors, a UV-emitting LED combined with blue- and yellow-emitting phosphors, and a UV-emitting LED combined with blue-, green-, and red-emitting phosphors. The phosphors can be electrophoretically deposited. Alternatively, the LED can be coated with the phosphor, using a silicone binder to adhere phosphor particles to the LED. Phosphors can be molded, dispensed, screen printed, sprayed, or laminated. A phosphor contained in glass, or a pre-formed sintered ceramic phosphor can be attached to the LED.

The light reflective material 140 can include inorganic, or organic/inorganic binder and filler material. For example, organic/inorganic binder and filler can be silicone with embedded reflective titanium oxide ($TiO_2$) or other reflective/scattering particles. Inorganic binders can include sol-gel (e.g., a sol-gel of TEOS or MTMS) or liquid glass (e.g., sodium silicate or potassium silicate), also known as water glass. In some embodiments binders can include fillers that adjust physical properties. Fillers can include inorganic nanoparticles, silica, glass particles or fibers, or other materials able to improve optical or thermal performance.

In one embodiment, the light reflection material 140 can include at least one of $SiO_2$ and $TiO_2$. In other embodiments, the light reflective material includes between 10% to 20% $Al_2O_3$ in combination with $SiO_2$ and $TiO_2$. In selected embodiments, the light reflective material includes $SiO_2$ and less than 30% $TiO_2$. $SiO_2$ and $TiO_2$ hybrid materials, for example $SiO_2$ particles coated with $TiO_2$, can be used in concentrations up to 80%, or $SiO_2$ concentrations up to 80% can be used with added $TiO_2$.

While the foregoing discussed solids can be 70% to 90% of the light reflective material, a binding agent such as silicone rubber is needed and may be present at, for example, between 5% and 40%. In other embodiments, between 10% and 30% silicone rubber is used. In still other embodiments, silicone rubber can be combined with between 10% and 80% $TiO_2$. In yet another embodiment, silicone rubber can be combined with between 20% and 70% $TiO_2$.

The light reflective material can be applied to the sidewalls 122 and 132 by various processes, including molding, dispensing, screen printing, spray, or lamination. In one low cost molding process, diced LEDs and attached ceramic phosphors are located on a tile or tape and separated to allow the light reflection material 140 to penetrate between them and cover the side walls. A mold chase can be designed to create only a thin layer on top of the phosphor 130. This thin layer can be removed by blasting or etching to permit light emission.

Figure 2A:
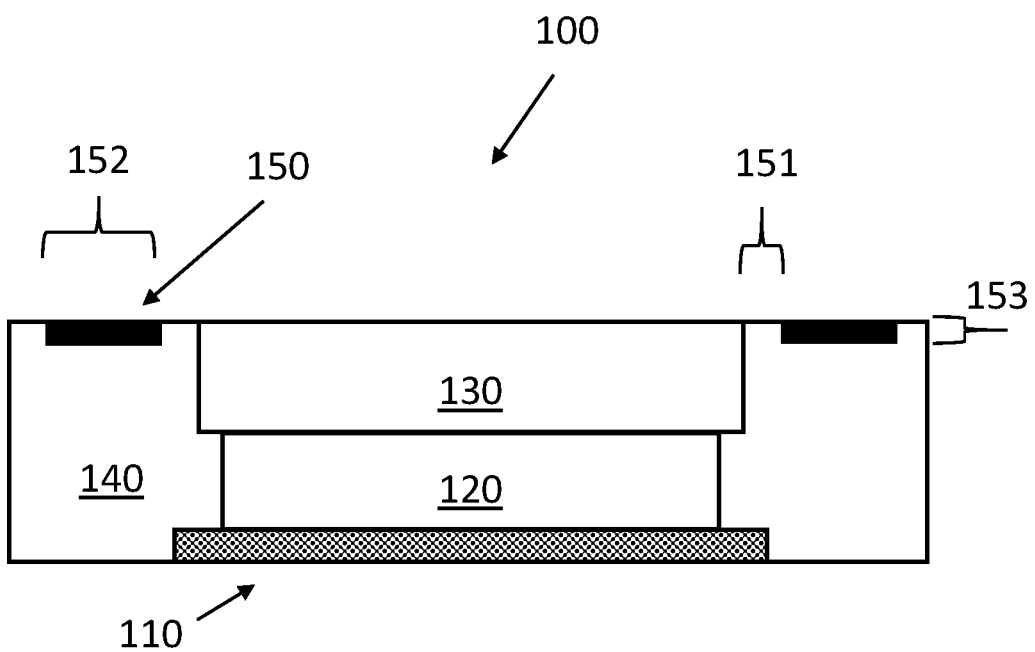
FIG. 2A is a side cross-sectional view illustrating the light emitting device of FIG. 1, after formation of a light absorptive region in a light reflective layer.
Figure 2B:
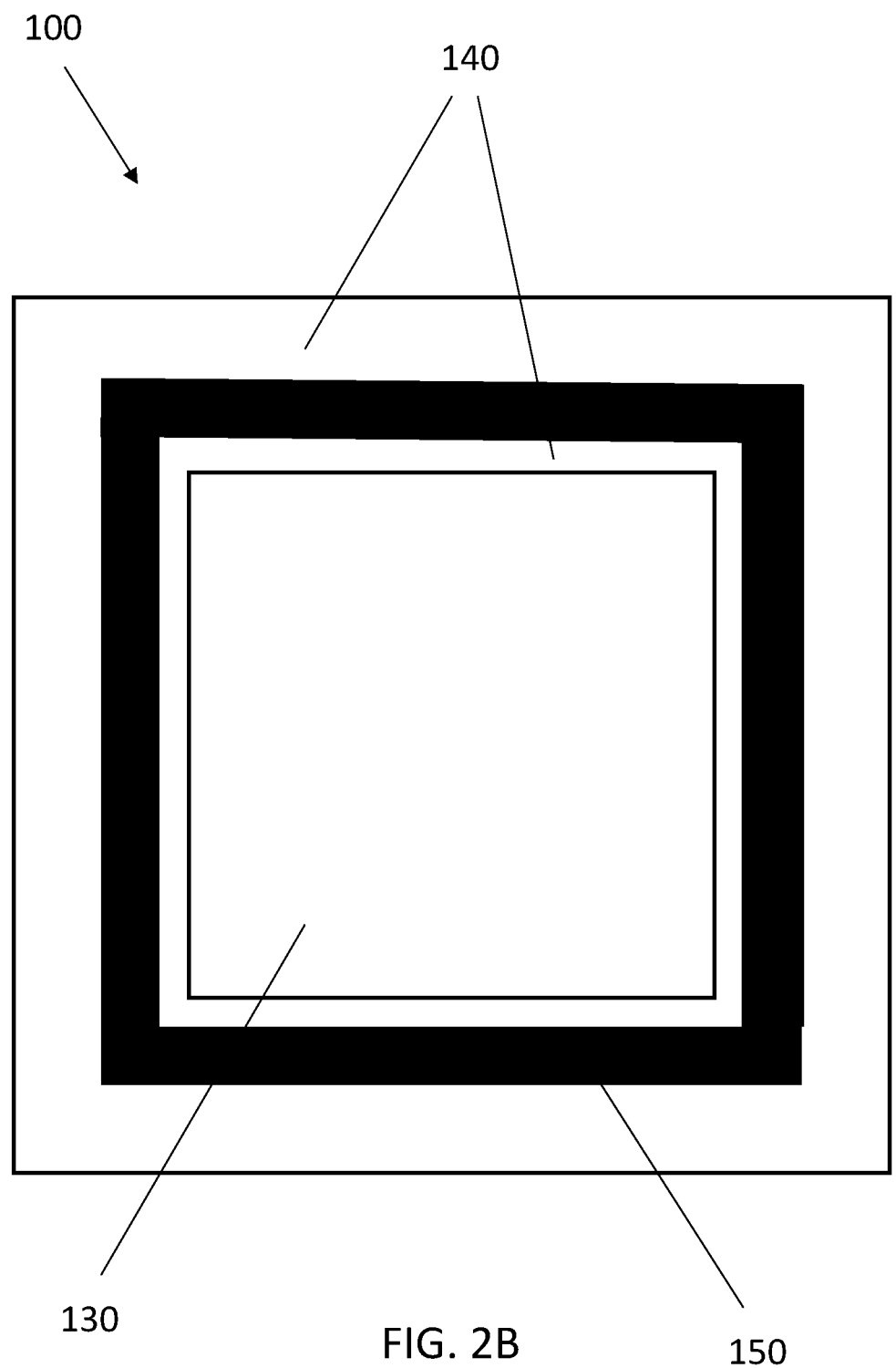
FIG. 2B is a top view illustrating the light emitting device of FIG. 2A.
Figure 3:
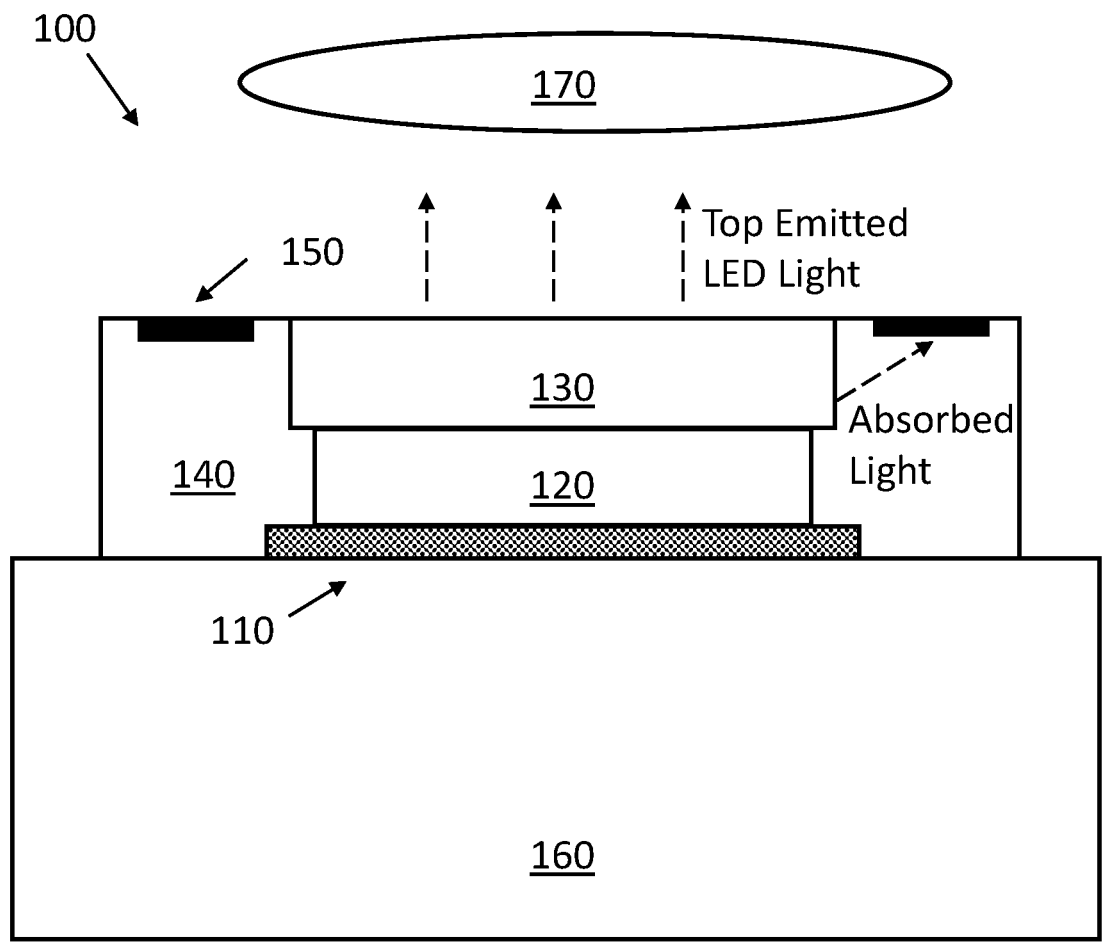
FIG. 3 is a side cross-sectional view of the light emitting device of FIG. 2A and FIG. 2B in combination with a supporting printed circuit board and optics.

As seen in FIG. 2A and FIG. 2B, the light emitting device 100 can be processed to define a light absorptive region 150 in the light reflective material 140. This light absorptive region 150 can be positioned to completely or partially surround the phosphor 130, while defining a gap 151 therebetween of, for example, at least 30 microns. In certain embodiments, the gap can be between 40 and 60 microns, and in some embodiments can be 50 microns or greater. The gap may alternatively have a width less than 30 microns. Advantageously, this arrangement prevents direct side emission from the phosphor side walls 134, since light is reflected back into the phosphor by light reflecting material 140. Secondly, as shown in FIG. 3 light absorptive region 150 can absorb residual light channeled through light reflective material 140. Both features act to increase near field contrast of the LED package 100.

Light absorptive region 150 may be formed in light reflecting material 140 by illuminating light reflecting material 140 with a focused beam of 355 nm light, which may be produced for example by frequency tripling the output of a Nd: YAG laser. Absorptive region 150 can be defined, for example, by single, multiple, contiguous, or overlapping sweeps of the laser beam. The laser beam may have a power of, or example, 0.60+/−0.02 W and be pulsed at a frequency of 60 kHz, for example. The width of a line of absorptive material produced by a single sweep of the laser beam can be, for example, between 30 to 40 microns in a plane parallel to the light emitting surface of the phosphor structure, allowing for example a total width 152 (FIG. 2A) of about 150 microns for the light absorptive region 150 by sequentially overlapping eight lines. The total width 152 of the light absorptive region can be between 100 and 200 microns, for example. Light absorbing region 150 may penetrate into the light reflecting material to a depth 153 (FIG. 2A) of between 40 and 80 microns, for example, and typically penetrates to less than about 50 um. The gap 151 defined between the phosphor structure 130 and the light absorptive region 150 can be between 40 and 80 microns, for example, in the plane of the light emitting surface of phosphor structure 130.

Upon illumination with the 355 nm laser beam as just described, the illuminated regions of light reflecting material 140 become light absorbing rather than light scattering or light reflecting. Typically, the laser illumination removes some or all of the binding material form the light reflecting material 140 in the illuminated region. Some or all of the illuminated particles in the light reflecting material become light absorbing, rather than light scattering or light reflecting. This transformation of the light scattering particles may result from partial reduction of metal oxide particles to form light absorbing metallic material. This may be a thermal process, for example, resulting from local heating of light reflecting material 140 by the laser beam.

As seen in FIG. 3, the light emitting device may optionally include a submount or printed circuit board 160 connected for powering and controlling light production by the semiconductor LED 120. The printed circuit board 160 can include electrical vias, heat sinks, ground planes, electrical traces, and flip chip or other mounting systems. The submount or printed circuit board 160 may be formed of any suitable material, such as ceramic, silicon, aluminum, etc. If the submount material is conductive, an insulating layer is formed over the substrate material, and the metal electrode pattern is formed over the insulating layer. The submount acts as a mechanical support, provides an electrical interface between electrodes on the LED and a power supply (not shown), and provides heat sinking.

As also shown in FIG. 3, primary or secondary optics 170 can be attached or positioned near the light emitting device 100. Optics can include concave or convex lenses, lenslet arrays, graded index lens, reflectors, scattering elements, beam homogenizers, diffusers, or other light focusing or blurring optics. Protective layers, transparent layers, thermal layers, or other packaging structures can be used as needed for specific applications.

Having described the invention in detail, those skilled in the art will appreciate that, given the present disclosure, modifications may be made to the invention without departing from the spirit of the inventive concept described herein. Therefore, it is not intended that the scope of the invention be limited to the specific embodiments illustrated and described.

We claim:

1. A method of manufacturing a light emitting device, the method comprising:
    attaching to a light emitting diode a phosphor structure having a light emitting first surface, an oppositely positioned second surface, and sidewalls connecting the top and bottom surfaces, the second surface of the phosphor structure attached to a light emitting surface of the light emitting diode;
    disposing a light reflective material on the sidewalls of the phosphor structure; and
    illuminating an outer surface of the light reflective material with an ultraviolet laser to form in the light reflective material a light absorptive region surrounding a perimeter of the light emitting first surface of the phosphor structure.

2. The method of claim 1, wherein illuminating an outer surface of the light reflective material with an ultraviolet laser to form the light absorptive region comprises reducing metal oxide particles in the light reflective material to form light absorptive metallic material.

3. The method of claim 2, wherein the metal oxide particles comprise $TiO_2$.

4. The method of claim 3, wherein the metal oxide particles comprise the $TiO_2$ coating $SiO_2$ particles.

5. The method of claim 1, wherein the light absorptive region is spaced apart from the perimeter of the light emitting first surface of the phosphor structure by at least 30 microns in a plane of the light emitting first surface of the phosphor structure.

6. The method of claim 1, wherein the light absorptive region has a width in the plane of the light emitting first surface of the phosphor structure of between about 100 microns and about 200 microns.

7. The method of claim 1, wherein the light absorptive region has a depth of less than 50 microns perpendicular to the outer surface of the light reflective material.

8. The method of claim 1, wherein the light absorptive region has a depth of between 40 to 80 microns perpendicular to the outer surface of the light reflective material.

9. The method of claim 1, wherein the laser has a power of 0.60+/−0.02 W and is pulsed at a frequency of 60 KHz.

10. The method of claim 1, wherein the light reflective material comprises a silicone binder.

11. The method of claim 10, wherein the light reflective material comprises between 5% and 40% of the silicone binder.

12. The method of claim 1, wherein the light reflective material comprises $Al_2O_3$.

13. The method of claim 1, wherein the light reflective material comprises from 20% to 70% $TiO_2$.

14. The method of claim 1, further comprising applying the light reflective material to the sidewalls of the phosphor structure by molding, dispensing, screen printing, spray, or lamination.

15. The method of claim 1, wherein the light reflective material comprises sol-gel or liquid glass.

16. The method of claim 1, wherein the light reflective material comprises inorganic nanoparticles, glass particles or glass fibers.

17. The method of claim 1, wherein the light reflective material comprises an organic binder.

18. The method of claim 1, wherein the light reflective material comprises a binder, and illuminating the outer surface of the light reflective material removes some of the binder from an illuminated region.

19. The method of claim 18, wherein illuminating the outer surface of the light reflective material removes all of the binder from the illuminated region.

* * * * *